United States Patent [19]

Neiderhofer

[11] Patent Number: 5,387,861
[45] Date of Patent: Feb. 7, 1995

[54] PROGRAMMABLE LOW PROFILE UNIVERSALLY SELECTABLE BURN-IN BOARD ASSEMBLY

[75] Inventor: Michael Neiderhofer, Milpitas, Calif.

[73] Assignee: Incal Technology, Inc., Milpitas, Calif.

[21] Appl. No.: 78,428

[22] Filed: Jun. 16, 1993

[51] Int. Cl.⁶ .............................................. G01R 1/04
[52] U.S. Cl. .................................................. 324/158.1
[58] Field of Search ............ 324/158 F, 158 R, 158 P; 361/383–384, 395; 165/80.3–80.4

[56] References Cited

U.S. PATENT DOCUMENTS 5,093,982  3/1992  Gussman .............................. 29/705

*Primary Examiner*—Kenneth A. Wieder
*Assistant Examiner*—Barry C. Bowser
*Attorney, Agent, or Firm*—Fliesler, Dubb, Meyer & Lovejoy

[57] ABSTRACT

A programmable low profile universally selectable burn-in board is described comprising a mother board having a top surface and a bottom surface, a plurality of test socket means for a corresponding number of devices under test, a program card, male and female connectors for removably mounting the socket means to the top surface of the mother board and male and female connectors for mounting the program card to the bottom surface of the mother board. The mother board is further provided with a frame for providing strength and rigidity to the mother board. In one embodiment, a chamber is provided for enclosing the program card in such a manner that refrigerated air, dry nitrogen or other types of gases or fluids, is forced into the space provided thereby so as to reduce the operating temperature of the program card and its timing/driving/signal routing/signal processing components.

9 Claims, 6 Drawing Sheets

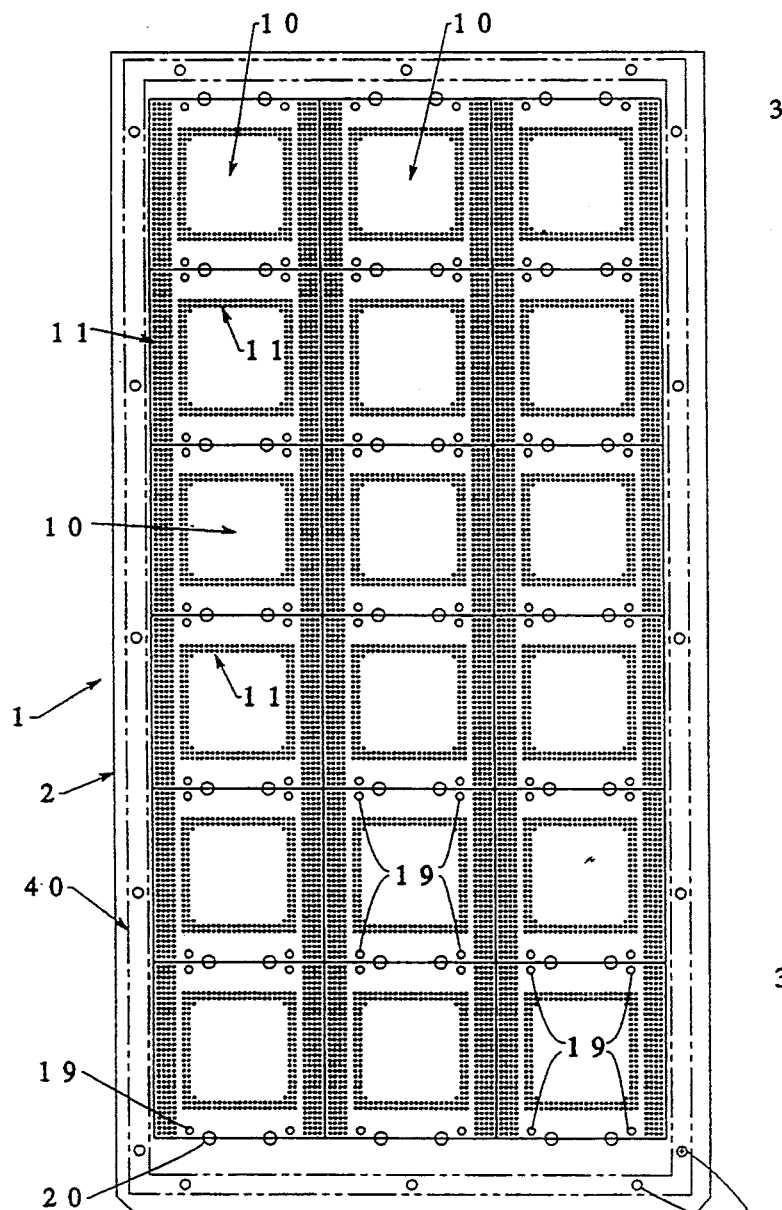
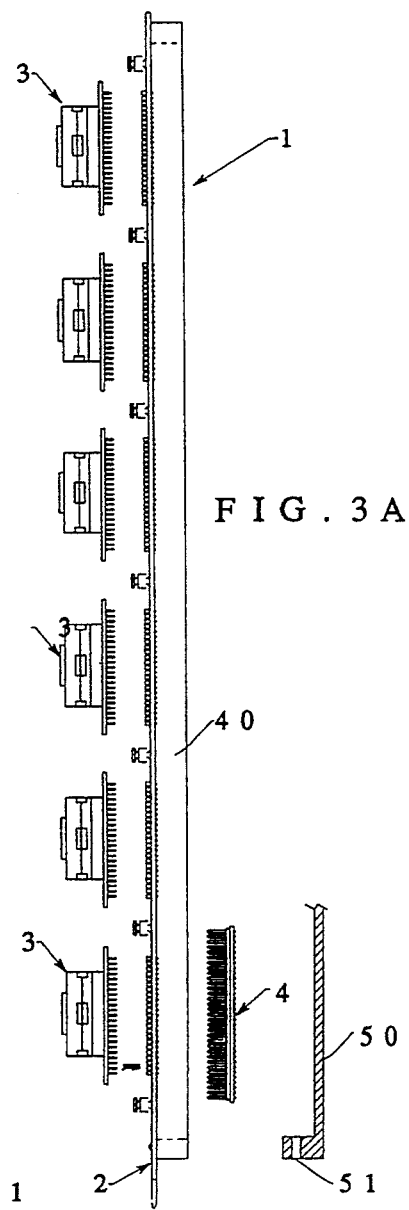
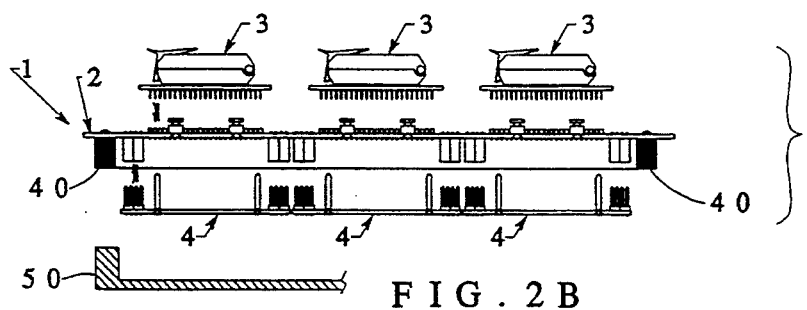
FIG. 1
FIG. 3A
FIG. 3B
FIG. 2A
FIG. 2B

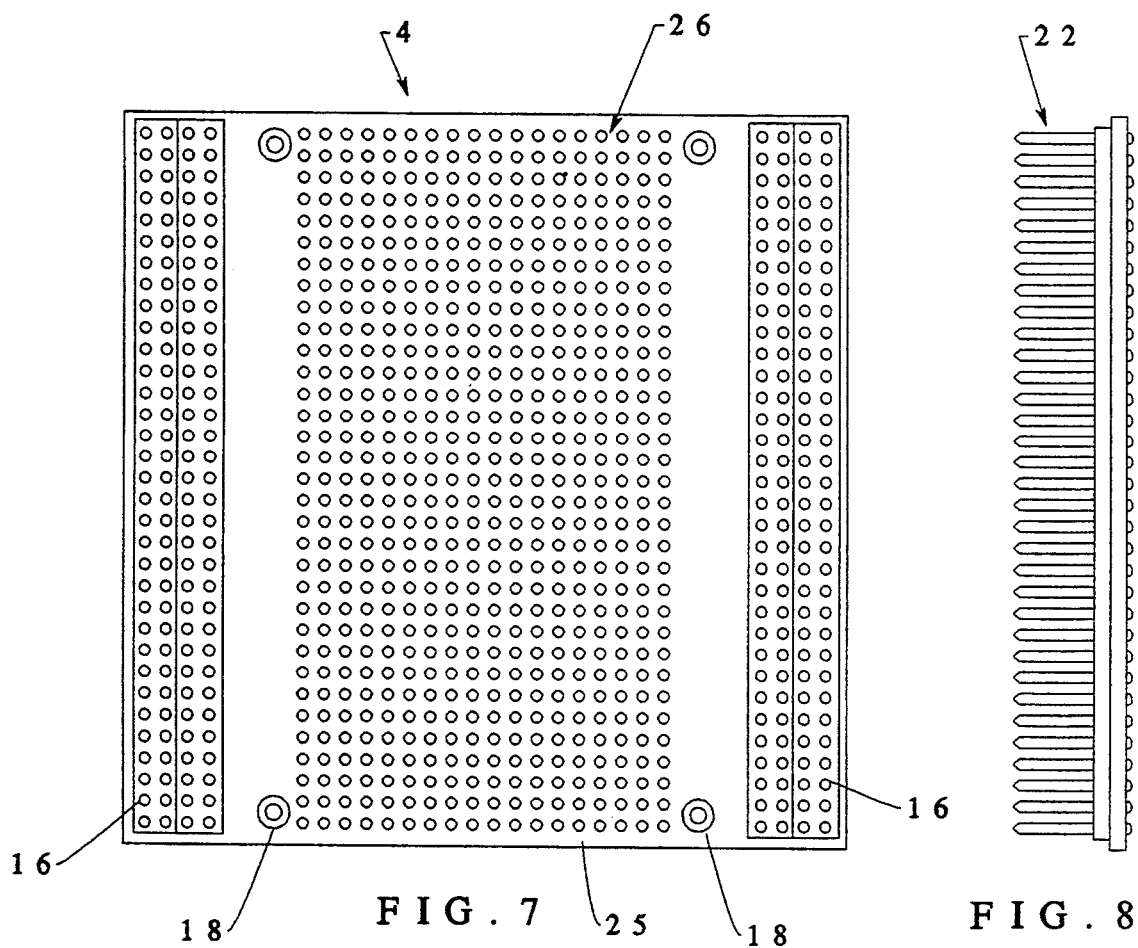
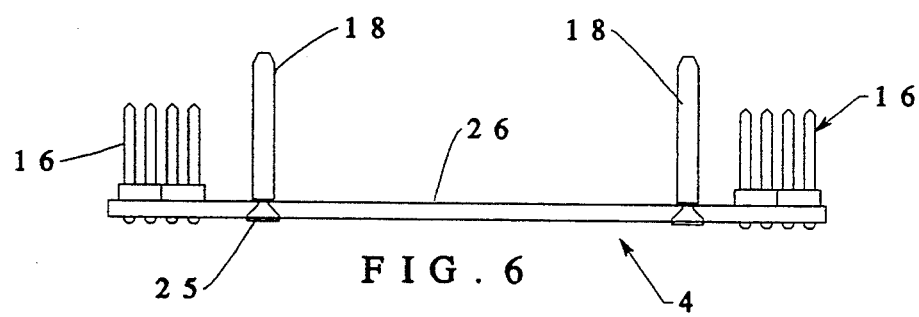
FIG. 7  FIG. 8  FIG. 6

PROGRAMMABLE LOW PROFILE UNIVERSALLY SELECTABLE BURN-IN BOARD ASSEMBLY

BACKGROUND OF THE INVENTION

1. Field of the Invention

The present invention relates to burn-in systems for burning in integrated circuits, hybrid modules and other electronic devices in general and in particular to a programmable low profile universally selectable burn-in board assembly for use in such systems.

2. Description of the Related Art

Typical burn-in board assemblies are constructed using two-sided or multilayer printed circuit burn-in mother boards to distribute DC voltages and circuit drive signals (data patterns) from input edge fingers to each socket on the burn-in mother board. The sockets and all peripheral components are soldered on the burn-in mother board using high temperature solder. Such burn-in mother boards are typically dedicated to a specific product and package type with the traces on the mother board comprising a fixed program for activating the components in the device mounted in the socket.

Other methods of programmability have been utilized in the past using dual row connectors and programmable printed circuit cards (program cards) which are positioned in a plane at a 90° angle from the plane of the burn-in mother board.

Still other methods of programmability have included arrangements wherein the connector and program card are installed in a parallel plane with the burn-in mother board to reduce the vertical height of the burn-in mother board and program card combination.

Both of the above-described methods tend to reduce the number of socket positions on a burn-in mother board. Moreover, the method in which the plane of the program card is 90° to the plane of the burn-in mother board also, in most cases, takes up two burn-in board positions in the burn-in system because of typical spacing between burn-in mother board positions in the system.

As will be noted, both of the above-described methods for creating a programmable burn-in mother board versus a dedicated burn-in mother board reduce the socket density on the burn-in mother board. Furthermore, the latter method in which the plane of the program card is 90° to the plane of the mother board also decreases the board density of the burn-in system by fifty percent (50%), thereby requiring a user to purchase twice as many burn-in systems for the same number of burn-in mother boards.

SUMMARY OF THE INVENTION

In view of the foregoing, a principal object of the present invention is a programmable low profile universally selectable burn-in board assembly (hereinafter "PLUSBIB"). In a preferred embodiment of the present invention, the PLUSBIB comprises a multi-layer burn-in mother board which can be adapted universally to use a multitude of different burn-in socket types for different package types of integrated circuits, modules, hybrids, etc., while providing independent voltage, signal and circuit component programmability on a socket position basis.

The PLUSBIB incorporates unique features. A first feature comprises a plurality of male and female pin connectors which provide the user with the ability to easily remove the sockets from the burn-in mother board and install other types of sockets in their places. A second feature which also comprises a plurality of male and female pin connectors provides the ability to independently program each socket position on the burn-in mother board. Both of these features are accomplished while increasing the burn-in mother board socket density when compared with other methods of programmability, such as those described above, as well as maintaining a low profile vertical height in order to make maximum use of a burn-in system. All burn-in mother board positions in the burn-in system are available for use with the PLUSBIB of the present invention.

BRIEF DESCRIPTION OF THE DRAWINGS

The above and other objects, features and advantages of the present invention will become apparent from the following detailed description of the accompanying drawings, in which:

FIG. 1 is a plan view of a mother board according to the present invention;

FIG. 2A is an exploded end view of a programmable low profile universally selectable burn-in board (PLUSBIB) assembly according to the present invention;

FIG. 2B is a partial cross-section end view of a cover member according to the present invention;

FIG. 3A is a side elevation view of a PLUSBIB assembly according to the present invention;

FIG. 3B is a partial cross-section side view of the cover of FIG. 2B;

FIG. 6 is an end view of one section of a program card according to the present invention;

FIG. 7 is a plan view of FIG. 6;

FIG. 8 is a side elevation view of FIG. 7;

DESCRIPTION OF THE PREFERRED EMBODIMENTS

Figure 5:
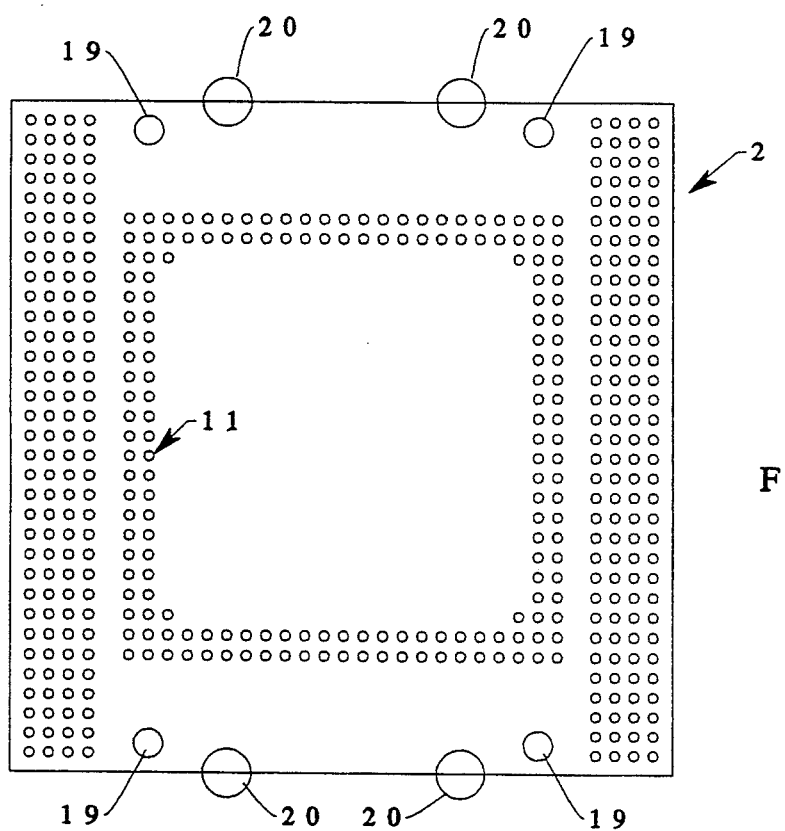
FIG. 5 is a plan view of one section of the mother board of FIG. 1 and the mother board of FIG. 4.

Referring to FIGS. 1-11, there is provided in accordance with the present invention a programmable low-profile universally selectable burn-in board (PLUSBIB) assembly according to the present invention, designated generally as 1. In the assembly 1 there is provided a mother board 2, a plurality of socket adapter board assemblies 3 and a plurality of program cards 4.

As seen most clearly in FIGS. 1, 2A and 3A, the mother board 2 comprises a plurality of socket positions 10. In the embodiment shown there are eighteen such socket positions 10.

Figure 4:
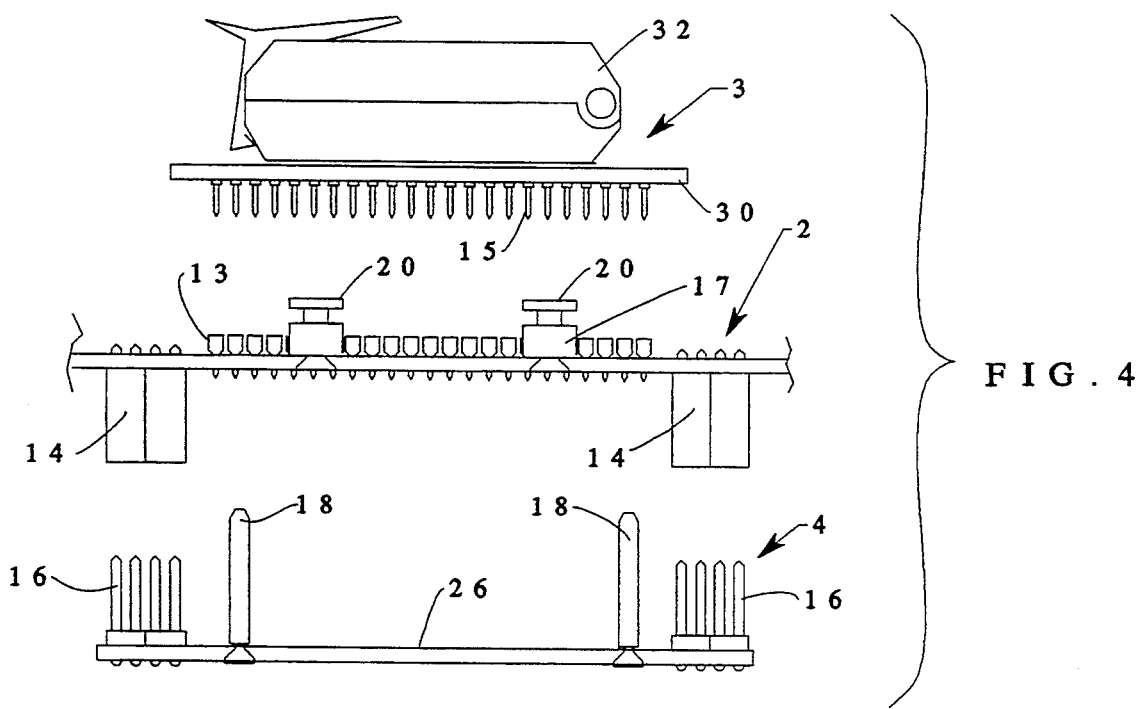
FIG. 4 is an exploded end view of one section of the PLUSBIB assembly according to the present invention.

The mother board 2 can be either a two-sided or a multi-layer printed circuit board. The mother board 2 has a matrix of through holes 11 making mechanical and electrical contact to circuit traces (not shown). The circuit traces connect the matrix of holes 11 to edge fingers 12 at one end of the mother board 2. Screw machine female contact pins 13 and 14, as shown in FIG. 4, are soldered into the mother board 2 from the top and bottom of the board, respectively, and are nearly flush with the surface of the board. The matrix of holes 11 with the soldered pins 13 and 14 is physically positioned in a manner to accept a corresponding matrix of male pins 15 and 16 of both the socket adapter board assembly 3 from the top and the program card 4 from the bottom of the mother board 2, respectively.

The mother board 2 may or may not have other components installed on the board. These may include capacitors, resistors, jumpers or other components typically used on mother boards.

Adjacent to each socket position 10, there is provided four guide pins/extraction posts 18 which are in registration with holes 19 provided in the mother board 2. Interior of the pins 18 and holes 19 in each socket position 10 on the mother board 2 there is provided a pair of turrets 20 for use with a tool (not shown) to separate the socket adapter assembly 3 and the program card assembly 4 from the mother board 2.

Referring to FIGS. 6, 7 and 8, the program card assembly 4 comprises a printed circuit board 25 which is used to program each socket position 10 with the appropriate voltage and signal conditions to be used during the burn-in process. It is also used to make mechanical and electrical connections of resistors, capacitors, jumpers and other individual circuit components (not shown) to the burn-in mother board 2. The components, wires, etc., are soldered to the printed circuit board 25 in holes 26 provided therefor in the center of the board and make electrical contact with circuit traces (not shown) on the printed circuit board 25. The circuit traces make electrical contact with the matrix of male pins 16 extending along opposite edges of the printed circuit board 25 which, in turn, makes electrical contact through insertion into corresponding female screw machine contact pins 14, respectively, extending downwardly from the bottom surface of the mother board 2 as shown in FIG. 4. The program card assembly 4 fits horizontally on the bottom of the burn-in mother board 2.

Figure 10:
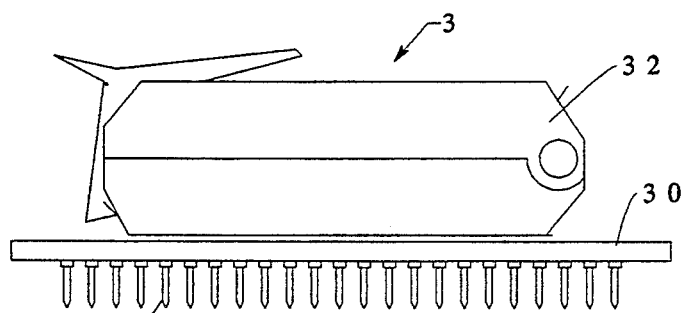
FIG. 10 is an end elevation view of a socket adapter assembly according to the present invention.
Figure 9:
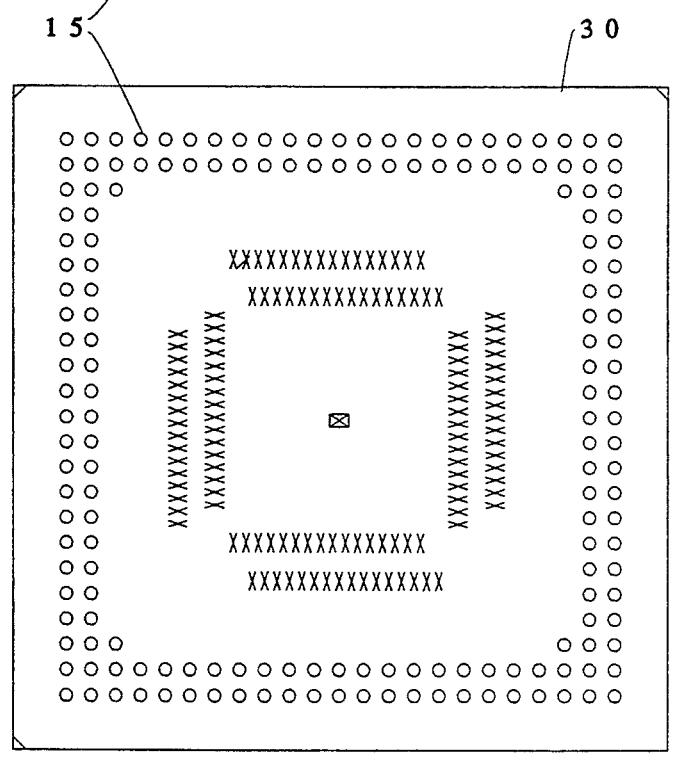
FIG. 9 is a plan view of a socket adapter card according to the present invention.
Figures 12, 13, 14:
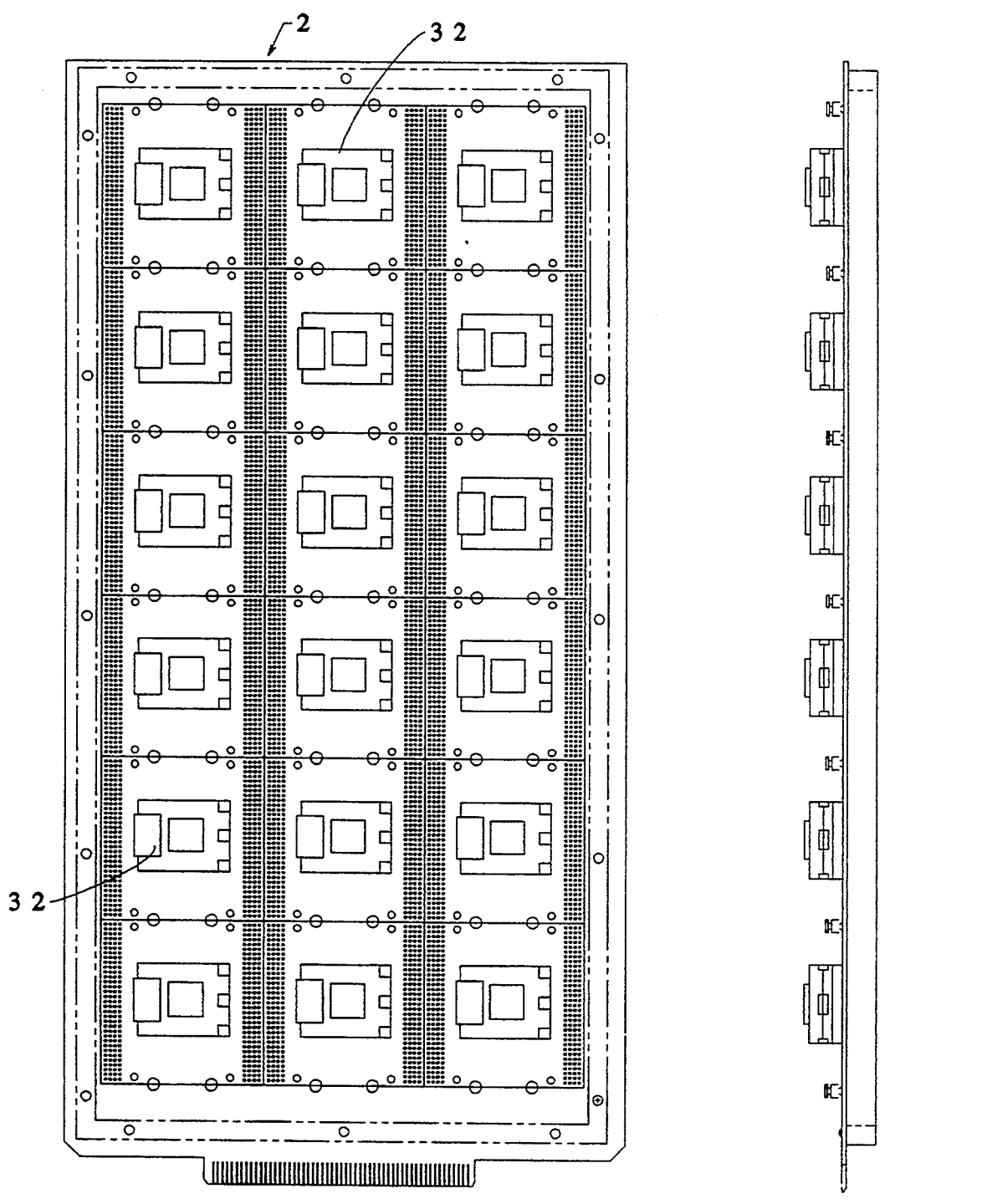
FIG. 12 is a plan view of a PLUSBIB assembly according to another embodiment of the present invention.
FIG. 13 is a side elevation view of FIG. 12.
FIG. 14 is an exploded end view of the PLUSBIB assembly of FIG. 12.
Figure 16:
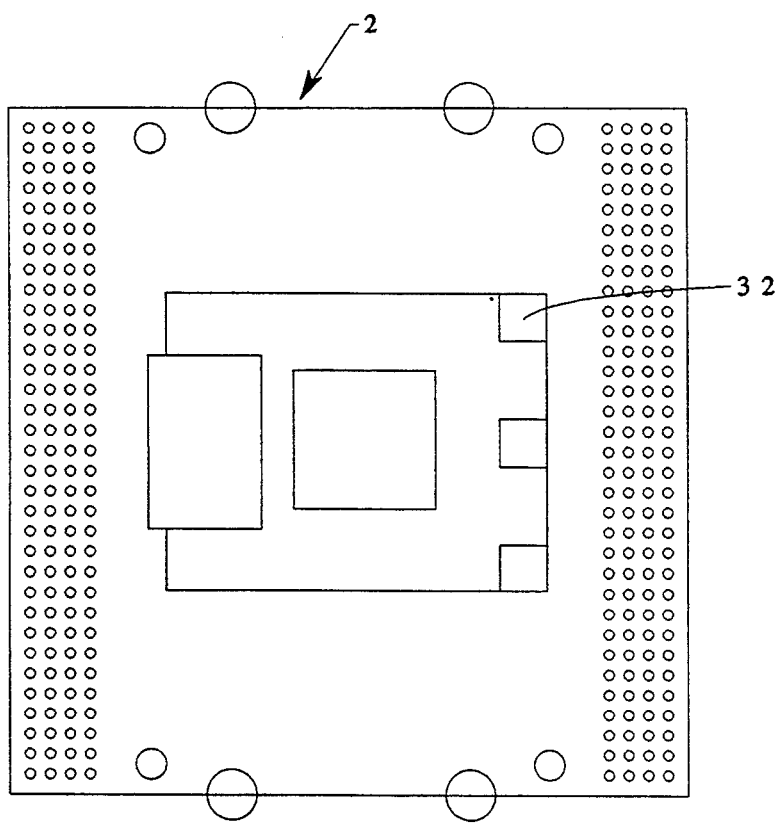
FIG. 16 is a top plan view of FIG. 15.
Figure 15:
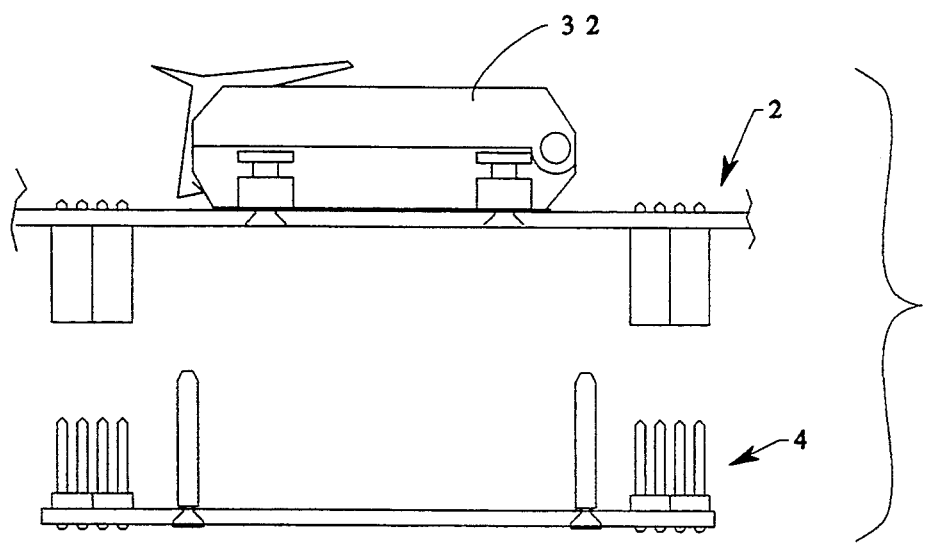
FIG. 15 is an exploded end view of one section of the PLUSBIB assembly of FIGS. 12-14.

Referring to the top of FIG. 4 and FIGS. 9-10, the socket adapter board assembly 3 comprises a printed circuit board 30 having the press-fitted pin members 15 extending from the bottom surface thereof. A test socket 32 for a device under test (DUT) is soldered to the top surface of the printed circuit board 30. Pins (not shown) on the bottom of the socket 32 make electrical contact with circuit traces (not shown) on the circuit board 30. The circuit traces make electrical contact with the matrix of male pins 15 extending from the bottom surface of the board 30 which, in turn, make electrical contact through insertion into the female screw machine contact pins 13 on the top of the burn-in mother board 2. The socket adapter board assembly 3 fits horizontally on top of the burn-in mother board 2.

Figure 11:
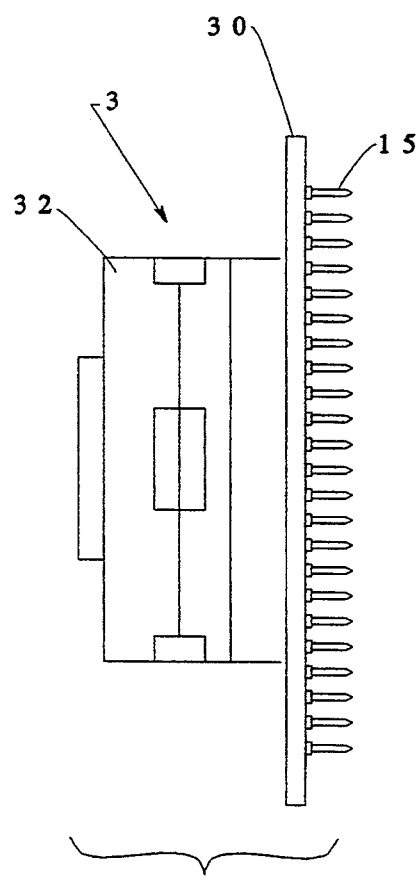
FIG. 11 is a side elevation view of a socket adapter assembly according to the present invention.

While the socket adapter board assembly 3 of FIGS. 9-11 is described above as comprising a single socket, it will be appreciated that there could be more than one socket assembled on the socket adapter board 30 if the sockets are small enough. For example, it is possible to install from two to four 20-pin device sockets in the same overall space used by one 250-pin device socket with an appropriate matrix of through holes 11.

Referring to FIGS. 12-16, in another method additional socket density may be achieved on smaller package types by eliminating the socket adapter printed circuit board 30 altogether and attaching the sockets 32 directly onto the burn-in mother board 2. The other elements of the assembly, i.e., the program card assembly 4 and burn-in mother board assembly 2, remain the same as described above. Of course, it will be recognized that the ability to change sockets is no longer possible. The trade-offs are in the area of cost. When one tries to use the socket adapter printed circuit board 30 to be able to use a wide range of socket types for low pin count devices through high pin count devices, the density of the burn-in mother board 2 is reduced to accommodate the high pin count device sockets. In some cases, one can improve the densities four to five times by using the socket adapter card printed circuit board concept for high pin count devices and using the burn-in mother board socket attachment method for lower pin count devices.

Referring again to FIGS. 1, 2A and 3A, the burn-in mother board 2 comprises an aluminum frame designated generally as 40. The frame 40 comprises an aluminum bar assembly having a rectangular cross-section which is used to provide rigidity and strength to the overall burn-in mother board 2. It consists of two lengths of aluminum bar for the width of the mother board 2 and two lengths for the length of the mother board 2. The aluminum bars are assembled together so that they form a rectangular shape which fits just inside the outline of the mother board 2. The frame 40 is attached to the mother board 2 by the use of screws and Teflon washers 41. Teflon washers are used to isolate the mother board 2 electrically from the frame 40. Teflon is used for its isolation and temperature resistant properties.

In practice, the mother board 2 is approximately 24 inches long and 11½ inches wide and together with its socket adapter assembly 3 and program card 4, is approximately 1.3 inches thick. Preferably, the program card assembly 4 is designed to fit within the space enclosed by the frame 40.

With the higher complexities of integrated circuits, hybrids, modules, etc., higher pin counts are becoming the norm as are the frequencies at which they are capable of being operated.

Bringing the burn-in drive circuitry closer to the devices being burned-in greatly reduces high frequency drive problems, because at high frequencies it is difficult to drive signals the length of a conventional burn-in mother board, e.g., 24 inches. Mounting the driver boards in the manner described above with respect to the program card 4 or including the drive circuitry on the program card 4 would put critical drive components in close proximity to the devices being burned in. With multiple drive/program cards established along the underside of the burn-in mother board 2, drive components are very close to their counterpart devices under test.

Using the same example, a multitude of input/output (I/O) pins could be used to provide the increasing number of pins required on existing and future devices and timing/drive circuitry with a large number of drive pins could be provided. In such cases, power is brought in from the edge of the burn-in mother board as is currently done, and this power is provided to power the timing/drive circuitry.

Referring again to FIGS. 2A and 3A, to further reduce the cost of manufacture, it is preferable to operate the timing/drive circuitry at lower temperatures than the burn-in test temperatures in order to extend the life of the timing/drive components and be able to use lower cost components rated at standard temperature ranges. For this purpose, an enclosed airtight chamber is provided on the underside of the burn-in mother board 2 by attaching a rectangular cookie sheet-like cover member 50 (shown in partial cross-section in FIGS. 2B and 3B) as by screws 41 to the mother board 2. If this is done, the cover 50 would function as a frame member in lieu of the frame 40. Refrigerated air, dry nitrogen, or other types of gases or fluids, is then forced into the chamber through passageways 51 provided therefor in order to maintain a lower ambient temperature around the timing/drive components than is being seen by the devices being burned in under test conditions.

In a manner described above with respect to FIGS. 12–16, another advantage of the present invention is to use the program card assembly 4 in relation to a standard dedicated burn-in mother board with input/output load resistors. Dedicated means that the burn-in mother board is designed for a single device type in one package configuration. The load resistors are typically mounted beside or around the sockets on top of the burn-in mother board. This obviously uses real estate on the burn-in mother board. There are certain situations where these resistors and/or other components could be mounted on program cards 4 so that the top side of the burn-in mother board 2 could be used strictly for sockets. This would, in some cases, significantly improve the density of the burn-in mother board.

While preferred embodiments of the present invention are described above, it is contemplated that numerous modifications may be made thereto for particular applications without departing from the spirit and scope of the present invention. For example, the mother board 2 or any of the other boards can be any suitable size and the program card 4 may comprise signal timing, signal driving, signal routing and signal processing components or any combination thereof. Accordingly, it is intended that the embodiments described be considered only as illustrative of the present invention and that the scope thereof should not be limited thereto but be determined by reference to the claims hereinafter provided.

What is claimed is:

1. A programmable low profile burn-in board assembly comprising:

a mother board having a top surface and a bottom surface;

a plurality of test socket means for a plurality of devices under test (DUT);

a program card means for routing signals to each of said test socket means;

means for mounting said plurality of test socket means in a corresponding number of positions on the top surface of said mother board; and means for mounting said program card means to the bottom surface of said mother board.

2. An assembly according to claim 1 wherein said mounting means comprises means for removably mounting at least one of said test socket means and said program card means to said mother board.

3. An assembly according to claim 1 wherein said mounting means comprises means for removably mounting both said test socket means and said program card means to said mother board.

4. An assembly according to claim 2 wherein said removable mounting means comprises male and female pin connector means.

5. An assembly according to claim 3 wherein said removable mounting means comprises male and female pin connector means.

6. An assembly according to claim 2 comprising turret means mounted on said mother board for use with a tool to separate said at least one of said test socket means and said program card means from said mother board.

7. An assembly according to claim 6 comprising pin member means which is mounted on said program card means and which extends upwardly toward said mother board to be engaged by said tool to separate said program card means from said mother board.

8. An assembly according to claim 1 comprising:
   means for providing a rectangular frame means;
   means for mounting said frame means to the bottom surface of said mother board such that said frame means is located adjacent to the edges of said mother board; and
   wherein said rectangular frame means and said means for mounting said program card means comprises means for mounting said program card means to the bottom surface of said mother board wholly within the space enclosed by said frame means.

9. An assembly according to claim 1 comprising:
   means forming an airtight chamber on the bottom surface of said mother board;
   means for mounting said program card means to said mother board within said chamber; and
   means for injecting cooling means into said chamber for cooling said program card means.

* * * * *